(12) United States Patent
Hsu

(10) Patent No.: US 9,679,637 B1
(45) Date of Patent: Jun. 13, 2017

(54) SINGLE-ENDED MEMORY DEVICE WITH DIFFERENTIAL SENSING

(71) Applicant: Taiwan Semiconductor Manufacturing Co., Ltd., Hsin-Chu (TW)

(72) Inventor: Kuoyuan Hsu, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/288,235

(22) Filed: Oct. 7, 2016

(51) Int. Cl.
| | | |
|---|---|---|
| *G11C 11/00* | (2006.01) | |
| *G11C 11/419* | (2006.01) | |
| *G11C 11/418* | (2006.01) | |
| *G11C 7/14* | (2006.01) | |
| *G11C 16/10* | (2006.01) | |
| *G11C 7/12* | (2006.01) | |
| *G11C 16/28* | (2006.01) | |
| *G11C 7/08* | (2006.01) | |

(52) U.S. Cl.
CPC .............. *G11C 11/419* (2013.01); *G11C 7/08* (2013.01); *G11C 7/12* (2013.01); *G11C 7/14* (2013.01); *G11C 11/418* (2013.01); *G11C 16/10* (2013.01); *G11C 16/28* (2013.01)

(58) Field of Classification Search
CPC ..... G11C 11/418; G11C 11/419; G11C 16/10; G11C 16/28; G11C 7/12; G11C 7/14; G11C 7/08; G11C 7/222; G11C 8/18
USPC ....... 365/154, 156, 189.011, 189.02, 189.07, 365/189.06, 185.2, 185.21, 185.22, 194
See application file for complete search history.

(56) References Cited

U.S. PATENT DOCUMENTS

| | | | |
|---|---|---|---|
| 8,570,789 B2 * | 10/2013 | Chang | G11C 11/413 365/138 |
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,908,421 B2 | 12/2014 | Liaw | |
| 8,929,160 B2 | 1/2015 | Katoch et al. | |
| 8,942,049 B2 * | 1/2015 | Sridhara | G11C 7/08 365/154 |
| 8,964,492 B2 | 2/2015 | Hsu et al. | |
| 8,982,643 B2 | 3/2015 | Lum | |
| 9,093,126 B2 * | 7/2015 | Yang | G11C 11/413 |
| 9,117,510 B2 | 8/2015 | Yang et al. | |
| 9,208,858 B1 | 12/2015 | Lin et al. | |
| 9,218,872 B1 | 12/2015 | Liaw | |
| 2014/0153345 A1 | 6/2014 | Kim et al. | |
| 2014/0233330 A1 | 8/2014 | Ko et al. | |
| 2015/0348598 A1 | 12/2015 | Wang et al. | |

(Continued)

*Primary Examiner* — Gene Auduong
(74) *Attorney, Agent, or Firm* — Duane Morris LLP

(57) ABSTRACT

A memory device includes a first memory array comprising a first bit cell and a second bit cell that are configured to provide a first reference signal and a second reference signal, respectively; a second memory array comprising a third bit cell that is configured to store a first logical state; a reference signal provision (RSP) unit, coupled to the first memory array, and configured to short the first and second reference signals so as to provide an averaged reference signal; and a sensing amplifier, coupled between the RSP unit and the second memory array, and configured to use the averaged reference signal to read out the first logical state stored by the third bit cell.

20 Claims, 7 Drawing Sheets

(56) References Cited

U.S. PATENT DOCUMENTS

2015/0371702 A1* 12/2015 Wu .................. G11C 11/419
  365/156
2015/0380077 A1   12/2015 Wu et al.
2015/0380078 A1   12/2015 Liaw

* cited by examiner

SINGLE-ENDED MEMORY DEVICE WITH DIFFERENTIAL SENSING

BACKGROUND

Static random access memory (SRAM) devices are well-suited for providing working data storage, such as cache memory for processors. Recent system on a chip (SOC) designs often incorporate one, two or more "core processors," which are predesigned processors such as DSP's, RISC or ARM microprocessors, for example. These core processors are often arranged with a level one (L1) cache memory of SRAM cells laid out near or adjacent to the processor to enable fast processor operations. In many devices in which a dual-core approach is used, such as a radio transceiver integrated circuit, for example, at least one of the radio transceiver's cores may be implemented as a microprocessor core. Several SRAM arrays, each array including a plurality of bit cells, may be used in such integrated circuits.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
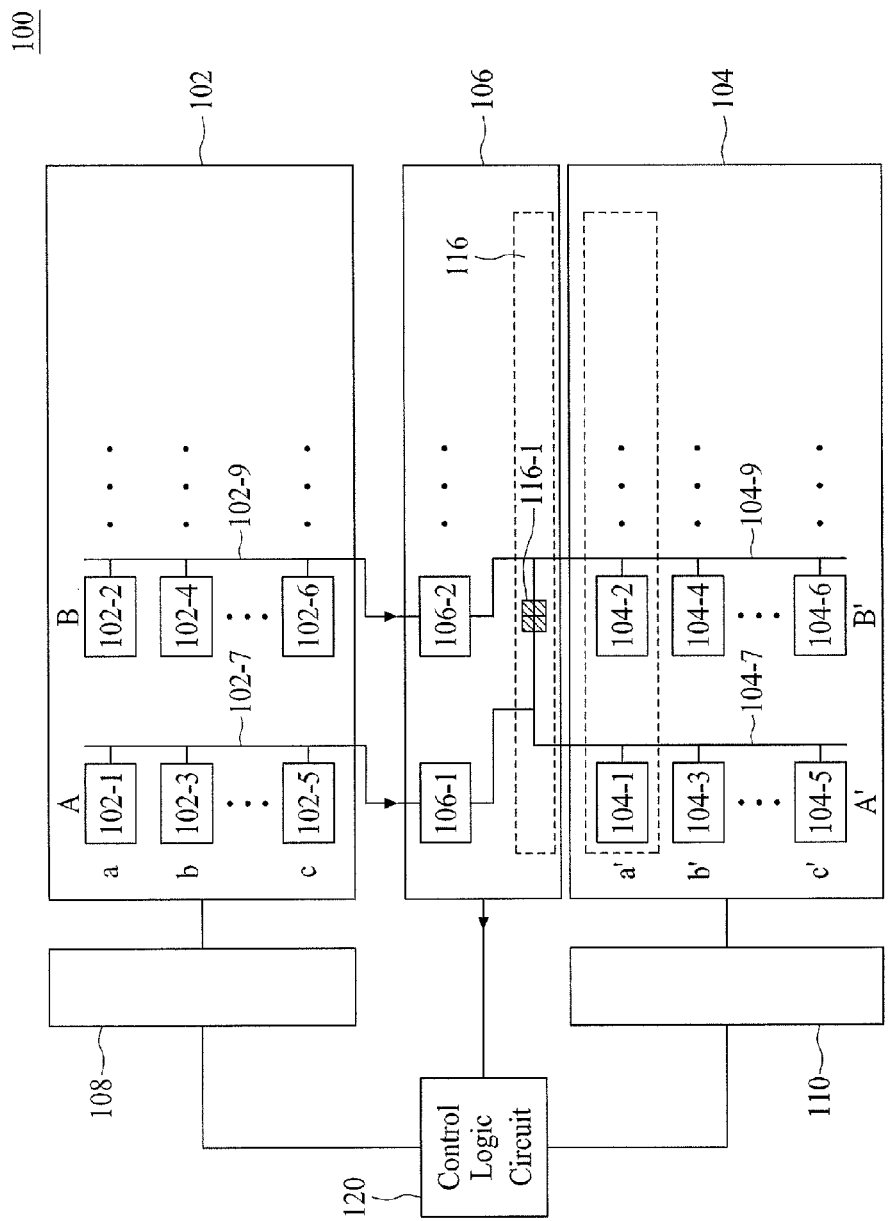
FIG. 1 illustrates an exemplary block diagram of a memory device that includes first and second memory arrays with an input/output (I/O) circuit coupled therebetween, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

A typical SRAM bit cell is arranged as a six transistor (6T) bit cell (or a 6T memory bit cell). Generally, in a 6T bit cell, read and write operations are performed through a single port and thus the 6T bit cell is categorized as a single-port bit cell. Due to the sharing of the single port for both read and write operations, a variety of issues may occur such as, for example, a data upset, a read disturbance, etc. To address such issues, some alternative arrangements of bit cells have been proposed, for example, a dual-port eight transistor (2P-8T) SRAM bit cell (hereinafter a "2P-8T bit cell") including two separate ports for read and write operations, respectively. Advantages of a separate read port are that the possibility of read disturbance is reduced, because a data bit stored in such a 2P-8T bit cell is not affected by a read operation.

However, to retrieve a data bit from such a dual-port bit cell (e.g., a 2P-8T bit cell), a single-ended input/output (I/O) circuit (e.g., a single-ended sensing amplifier) is generally used to read out the data through either a bit line (BL) or a bit bar line (BBL) of the bit cell. Reading the data from a single BL or a BBL typically requires a full voltage swing (e.g., from a supplied voltage of the bit cell (e.g., Vdd) to ground, or vice versa) on the respective BL or BBL to allow a large enough voltage drop to be detected by the single-ended sense amplifier. Such a full voltage swing requirement may in turn induce a variety of issues and constraints as a result of integrating plural dual-port bit cells in a large-scale system (e.g., a SOC). For example, due to the requirement of the full-voltage swing on the BL and/or BBL for each read operation, a speed of the read operation may be disadvantageously affected. In turn, each BL (or BBL) of a memory cell array can only accommodate up to a total of thirty-two 2P-8T bit cells without significantly sacrificing performance of the memory cell array (e.g., an operation speed). In some modern large-scale systems that requires at least 128 or more bit cells per BL or BBL, using such a 2P-8T bit cells may use additional I/O circuits to compensate for the increased number of bit cells, which in turn may cause a variety of real estate and/or power consumption issues.

The present disclosure provides various embodiments of a memory architecture (device) that includes plural memory arrays, wherein each BL or BBL of the memory array can accommodate up to 256 dual-port bit cells, or more, by using a reference BL/BBL signal (hereinafter "rBL signal"). More specifically, using such an rBL signal allows the disclosed memory device to use a differential sensing amplifier (i.e., a dual-ended sensing amplifier) to perform a read operation without requiring a full-voltage swing present on the BL or BBL. In some embodiments, the differential sensing amplifier may use the rBL signal as a reference that is associated with an intermediate (discharging) rate to compare a discharge rate or a leakage rate along the BL or BBL. As such, as long as a substantially smaller voltage drop (compared to the full-voltage swing) is present on the BL or BBL, the differential sensing amplifier may be able to read out a data bit from the (dual-port) bit cell. As such, the speed of read operations may be significantly improved while each BL or BBL can still accommodate up to 256 dual-port bit cells, which advantageously avoids sacrificing a substantial amount of real estate to accommodate additional I/O circuits. In some further embodiments, by averaging plural rBL signals along a reference row of a memory array, a "steady" discharging rate may be derived and used as a reliable reference for the differential sensing amplifier to perform read operation(s), which will be described in further detail below with respect to FIG. 4.

FIG. 1 illustrates an exemplary schematic diagram of a memory device 100 that includes two or more memory arrays, in accordance with various embodiments. As shown, the memory device 100 includes memory arrays 102 and 104, an input/output (I/O) circuit 106 coupled between the memory arrays 102 and 104, decoders 108 and 110 respectively coupled to the memory arrays 102 and 104, and a control logic circuit 120 coupled to the I/O circuit 106, and the decoders 108 and 110. It is noted that the illustrated embodiment of FIG. 1 is merely an example so that only two memory arrays (e.g., 102 and 104) and components that are related to the current embodiment (e.g., the decoders 108 and 110, the control logic circuit 120) are shown. Additional memory arrays and one or more other components such as, for example, a buffer circuit, a timing circuit, etc., may be included in the memory device 100 while remaining within the scope of the present disclosure.

More specifically, each memory array of the memory device 100 includes a plurality of bit cells. The plurality of bit cells are arranged in a column-row configuration, wherein each bit is arranged at an intersection of a corresponding column and a corresponding row. Each bit cell is configured to present/store a data bit (either a logical 1 or a logical 0) when the memory device 100 is read or written to after it is turned on. Moreover, each memory array includes a plurality of bit lines (BL's) and/or bit bar lines (BBL's) arranged along respective columns, and a plurality of word lines (WL's) arranged along respective rows. For clarity, only a BL is shown along each column in the illustrated embodiment of FIG. 1. Other BL's/BBL's along each column and WL's along each row will be shown and described in further detail below with respect to FIGS. 2A, 2B, and 2C. For example, the memory array 102 includes bit cells 102-1, 102-2, 102-3, 102-4, 102-5, and 102-6, wherein the bit cells 102-1 and 102-2 are arranged along a first row (row a); the bit cells 102-3 and 102-4 are arranged along a second row (row b); the bit cells 102-5 and 102-5 are arranged along a third row (row c). And bit cells along a same row are arranged in a separate and different column, respectively, for example, bit cells 102-1 and 102-2 along row a being respectively arranged in first and second columns (columns A and B), bit cells 102-3 and 102-4 along row b being respectively arranged in columns A and B, and bit cells 102-5 and 102-6 along row c being respectively arranged in columns A and B. More specifically, column A includes a BL 102-7 that is coupled to the bit cells along column A (e.g., 102-1, 102-3, 102-5, etc.); column B includes a BL 102-9 that is coupled to the bit cells along column B (e.g., 102-2, 102-4, 102-6, etc.). In accordance with some embodiments of the present disclosure, the BL's (102-7 and 102-9) shown in FIG. 1 are each coupled to a sensing amplifier (which will be described below) of the I/O circuit 106 and the BL's (102-7, 102-9, etc.) are typically referred to as "read bit lines (RBL's)" of the memory array 102, which will be discussed in further detail below with respect to FIGS. 2A-2C.

In some embodiments, the memory array 104 is substantially similar to the memory array 102 except that one of the rows of the memory array 104, e.g., row a', is configured to serve as a "reference row." Such a reference row is configured to provide the above-mentioned rBL signals, in accordance with some embodiments. More specifically, in some embodiments, each bit cell along the reference row is configured to provide one rBL signal through a respective RBL. Details of the rBL signals will be discussed further below with respect to FIGS. 2A-2C. The memory array 104 also includes bit cells 104-1, 104-2, 104-3, 104-4, 104-5, and 104-6, wherein the bit cells 104-1 and 104-2 are arranged along row a'; the bit cells 104-3 and 104-4 are arranged along row b'; the bit cells 104-5 and 104-5 are arranged along row c'. And the bit cells 104-1 and 104-2 along row a' are respectively arranged in columns A' and B'; the bit cells 104-3 and 104-4 along row b' are respectively arranged in columns A' and B'; the bit cells 104-5 and 104-6 along row c' are respectively arranged in columns A' and B'. Further, the bit cells 104-1, 104-3, and 104-5 along column A' are coupled to a corresponding sensing amplifier of the I/O circuit 106 through a respective RBL, e.g., 104-7; the bit cells 104-2, 104-4, and 104-6 along column B' are coupled to a corresponding sensing amplifier of the I/O circuit 106 through a respective RBL, e.g., 104-9. Although only six bit cells and corresponding numbers of rows and columns are shown in the illustrated embodiment of memory arrays 102 and 104, respectively, any desired number of bit cells may be each included in the memory arrays 102 and 104 while remaining within the scope of the present disclosure.

As described above, each column (or RBL) of the memory array (e.g., 102, 104, etc.) of the memory device 100 is coupled to a corresponding sensing amplifier of the I/O circuit 106. As shown in FIG. 1, column A of the memory array 102 and column A' of the memory array 104 are coupled to sensing amplifier 106-1 of the I/O circuit 106 through the RBL's 102-7 and 104-7, respectively; column B of the memory array 102 and column B' of the memory array 104 are coupled to sensing amplifier 106-2 of the I/O circuit 106 through the RBL's 102-9 and 104-9, respectively. Similarly, the number of sensing amplifiers (106-1, 106-2, etc.) is reflected in view of the number of coupled columns (or RBL's) so that in the illustrated embodiment of FIG. 1, only two sensing amplifiers 106-1 and 106-2 are shown.

In accordance with some embodiments, the I/O circuit 106 further includes a reference signal provision (RSP) circuit 116. In some embodiments, such an RSP circuit is generally coupled between the sensing amplifiers of the I/O circuit 106 (e.g., 106-1, 106-2, etc.) and a reference row of a memory array (e.g., row a' of the memory array 104), and comprises at least one RSP unit 116-1. In some embodiments the RSP circuit 116 includes a plurality of RSP units, wherein each RSP unit is coupled between at least two RBL's of the memory array and at least two sensing amplifiers, and further configured to receive at least two rBL signals from the coupled RBL's, respectively. In some embodiments, each RBL unit 116-1 is further configured to provide an averaged rBL signal, by shorting the at least two rBL signals, to the coupled sensing amplifiers. For example, the RSP unit 116-1 that is coupled between the RBL's 104-7 and 104-9 and the sensing amplifiers 106-1 and 106-2 is configured to receive rBL signals from RBL's 104-7 and 104-9 (e.g., signals 273 and 277 in FIG. 2A), respectively, and provide an averaged rBL signal (e.g., signal 271 in FIG. 2A) to the coupled sensing amplifiers 106-1 and 106-2, which will be described in further detail below with respect to FIGS. 2A-2C.

As described above, WL's of the memory arrays 102 and 104 are not shown in FIG. 1 and the shown BL's are referred to as RBL's. According to some embodiments of the present disclosure, in addition to the shown RBL's, each column of the memory array may include at least one BL and one BBL and each row of the memory array may include at least two WL's. As such, each bit cell is coupled to at least two WL's and three BL's (one RBL, one BL, and one BBL). More specifically, the BL and BBL included in each column are configured to be used during a write operation for the bit cells of that column, and thus are typically referred to as "a write bit line (WBL)" and "a write bit bar line (WBBL),"

respectively, which will be described in further detail below with respect to FIGS. 2A-2C. The at least two WL's included in each row are for the use of read and write operations, respectively, and thus are typically referred to as "read word line (RWL)" and "write word line (WWL)," respectively, which will also be described in further detail below with respect to FIGS. 2A-2C.

In some embodiments, each memory array's coupled decoder may be configured to assert one or more of the above-mentioned RWL's and WWL's (along rows) in response to a reception of addressing information (e.g., a row address) provided by the control logic circuit 120. For example, the decoder 108 may be configured to assert one or more RWL's and/or WWL's of the memory array 102, and the decoder 110 may be configured to assert one or more RWL's and/or WWL's of the memory array 104. Further, the control logic circuit 120 may be coupled to the I/O circuit 106 so as to retrieve data bits read by the sensing amplifiers (e.g., 106-1, 106-2, etc.) of the I/O circuit 106 during a read operation. These operations will be described in further detail below with respect to FIGS. 2A-2C.

Although, in the illustrated embodiment of FIG. 1, row a' of the memory array 104 serves as a reference row and accordingly, the RSP circuit 116 (and the RSP unit 116-1) is coupled between the reference row and the respective sensing amplifiers (e.g., 106-1 and 106-2), in some alternative embodiments, in addition to row a' of the memory array 104 being a reference row, at least one row of the memory array 102 may serve as a reference row as well. In such embodiments, the I/O circuit 106 may further include another RSP circuit/RSP units (e.g., 117-1 of FIG. 2C) coupled between the reference row of the memory array 102 and the respective sensing amplifiers of the I/O circuit 106. In some embodiments, this RSP unit 117-1 (FIG. 2C) is substantially similar to the RSP unit 116-1. Details of such dual-RSP circuits coupled to reference rows of "upper" and "lower" memory arrays, respectively, will be described further below with respect to FIG. 2C.

Figure 2A:
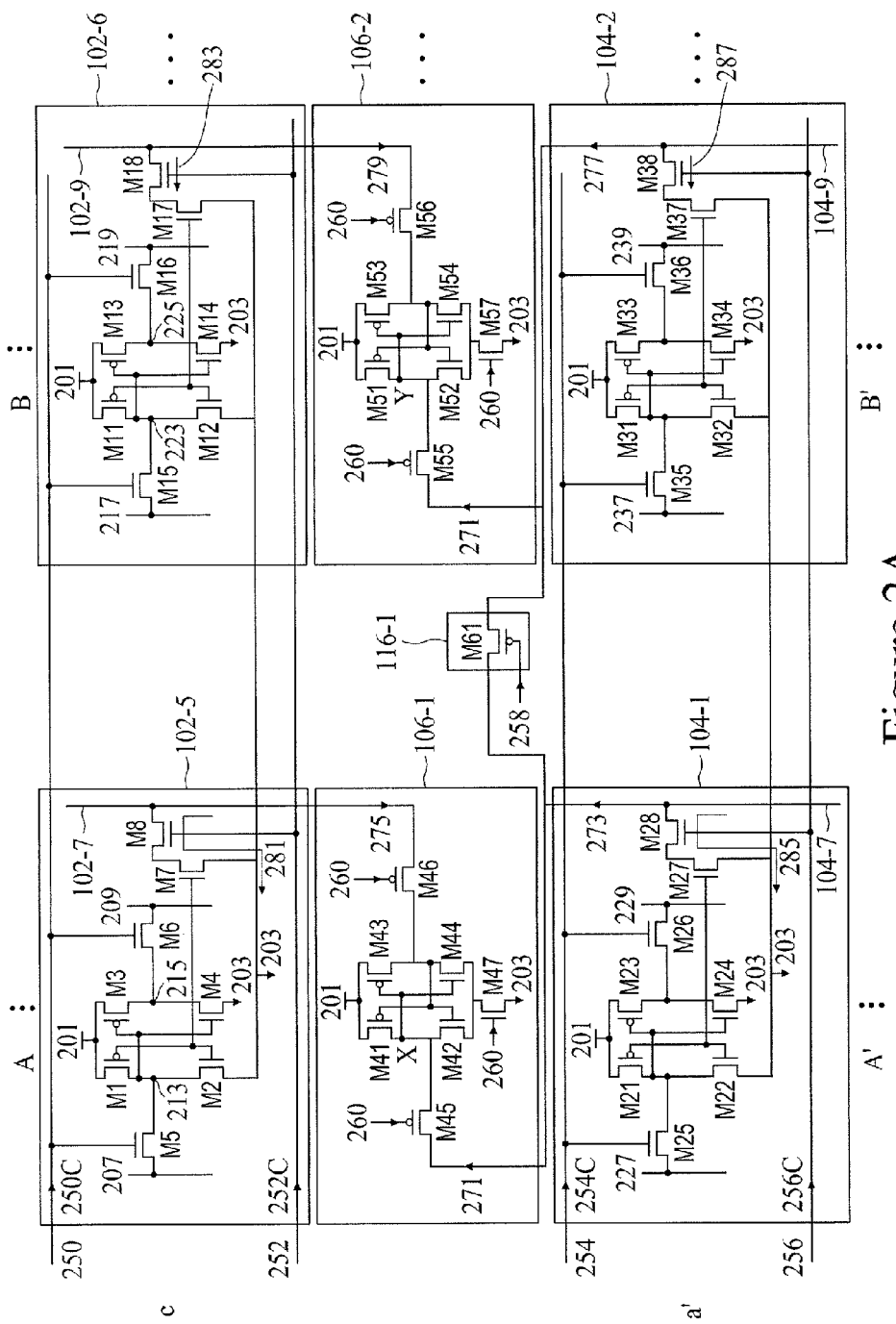
FIG. 2A illustrates an exemplary circuit diagram of an embodiment of the memory device of FIG. 1, in accordance with some embodiments.
Figure 2B:
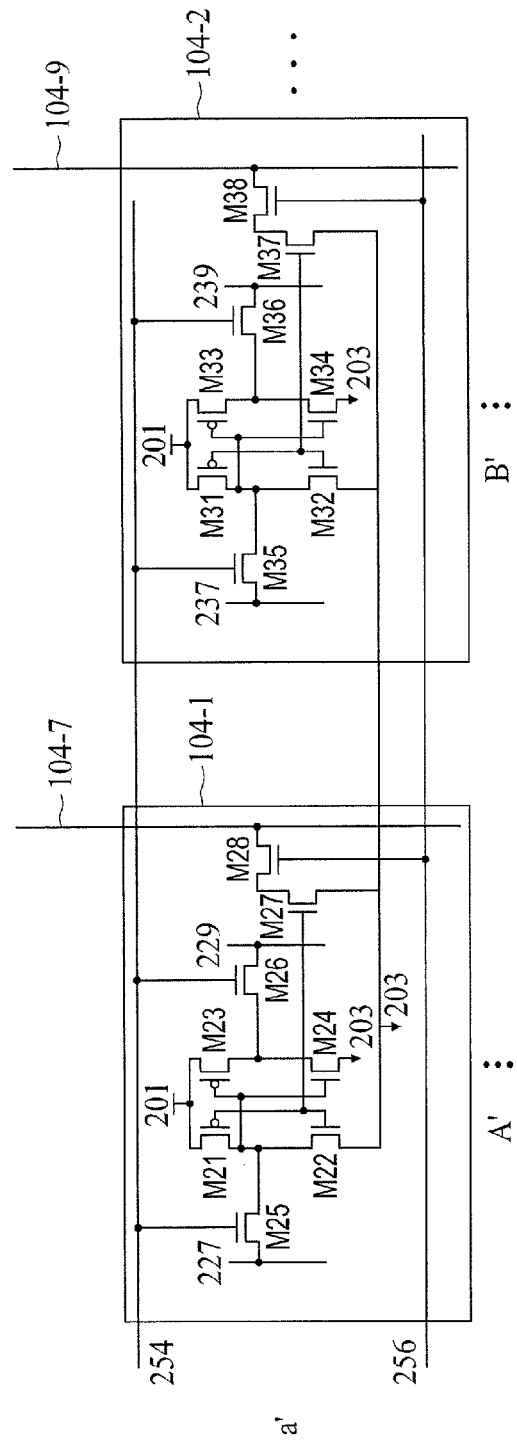
FIG. 2B illustrates an exemplary circuit diagram of another embodiment of the memory device of FIG. 1, in accordance with some embodiments.

FIGS. 2A and 2B are exemplary circuit diagrams illustrating embodiments of the memory device 100, respectively. Part of the memory array 102, part of the memory array 104 that includes a reference row (e.g., row a'), and part of the I/O circuit 106 are shown in FIGS. 2A and 2B, respectively. For clarity, both FIGS. 2A and 2B illustrate only bit cells 102-5 and 102-6 along row c of the memory array 102, bit cells 104-1 and 104-2 along the reference row a' of the memory array 104, corresponding sensing amplifiers 106-1 and 106-2, and the RSP unit 116-1.

More specifically, the exemplary circuit diagram of FIG. 2A includes two bit cells along the reference row a' (e.g., 104-1 and 104-2) that can each be programmed to store either a logical 1 or a logical 0 through corresponding components, which will be described in further detail below. In other words, each bit cell can be written to store a logical 1 or 0 and is not "hardwired" to store a particular value. In contrast, the exemplary circuit diagram of FIG. 2B includes two bit cells along the reference row a' (e.g., 104-1 and 104-2) that are each "hardwired" to write/present either a logical 1 or a logical 0, in accordance with some embodiments. In some embodiments, when a bit cell is hardwired to write a logical state, such a bit cell is configured to store the logical state permanently.

Figure 2C:
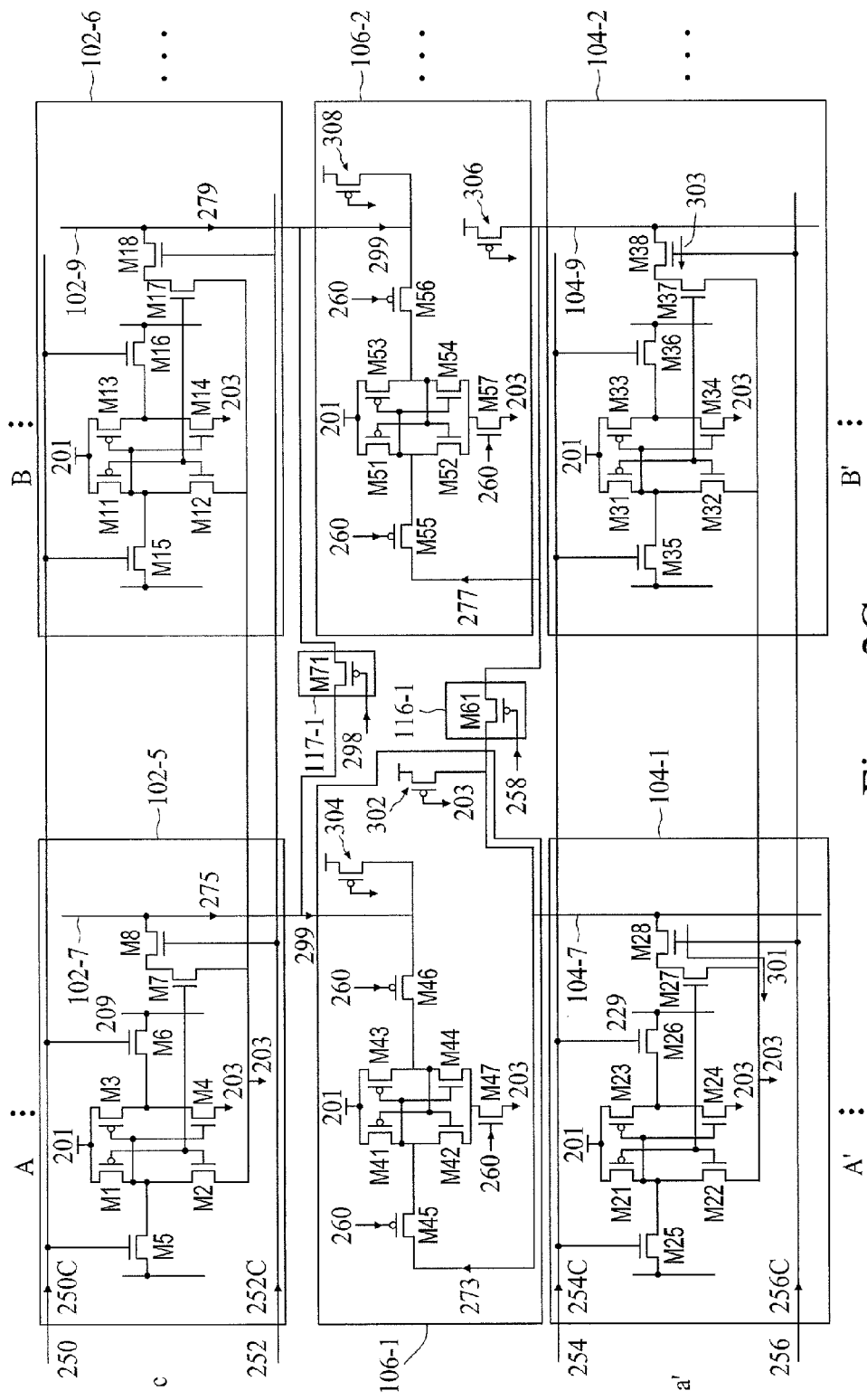
FIG. 2C illustrates an exemplary circuit diagram of yet another embodiment of the memory device of FIG. 1, in accordance with some embodiments.

FIG. 2C is substantially similar to FIGS. 2A and 2B except that the embodiment of FIG. 2C includes an additional reference row in the memory array 102. As mentioned above, with the additional reference row, an additional RSP circuit (RSP unit) may be coupled between the additional reference row and the I/O circuit 106 (FIG. 1). For example, FIG. 2C illustrates part of the memory array 102 that includes a first reference row (e.g., row c), part of the memory array 104 that includes a second reference row (e.g., row a'), and part of the I/O circuit 106. In addition to the bit cells 102-5 and 102-6, the bit cells 104-1 and 104-2, the sensing amplifiers 106-1 and 106-2, and the RSP unit 116-1 as shown in FIGS. 2A and 2B, FIG. 2C further illustrates the additional RSP unit 117-1 coupled between the bit cells 102-5 and 102-6 along the first reference row c and the sensing amplifiers 106-1 and 106-2. Similar to FIG. 2A, in FIG. 2C, the bit cells along the (first and second) reference rows c and a', e.g., 102-5, 102-6, 104-1, and 104-2, are not hardwired.

Referring now to FIG. 2A, in accordance with various embodiments, each of the bit cells of the memory arrays 102 and 104 is implemented as a 2P-8T bit cell. Although the cell bits are each implemented as a 2P-8T bit cell, the bit cell (e.g., 102-5, 102-6, 104-1, 104-2, etc.) of the memory arrays 102 and 104 is not limited to being implemented as a 2P-8T bit cell. The bit cell of the memory arrays 102 and 104 may be implemented as any of a variety of single-ended bit cells such as, for example, a single-ended nine transistor (9T) bit cell.

Referring first to the illustrated embodiment of the bit cell 102-5 in FIG. 2A, the bit cell 102-5 includes 8 transistors: M1, M2, M3, M4, M5, M6, M7, and M8. As described above, read and write operations are performed through a respective port in a 2P-8T bit cell. In the illustrated embodiment of the bit cell 102-5, the transistors M1-M6 constitute a six transistor (6T) core of a 2P-8T bit cell that is mainly configured to perform the write operation (i.e., including a write port), and the transistors M7 and M8 constitute a read buffer of the 2P-8T bit cell that is mainly configured to perform the read operation (i.e., including a read port). Details of the layout and operation of the bit cell 102-5 will be described below.

In the 6T core of the bit cell 102-5, the transistor M1 and M2 are formed as a first inverter and the transistors M3 and M4 are formed as a second inverter wherein the first and second inverters are cross-coupled to each other, as shown. More specifically, the first and second inverters are each coupled between first voltage reference 201 and second voltage reference 203. Generally, the first voltage reference 201 is a voltage level of a supply voltage applied on the cell bits of the memory array 102. The first voltage reference 201 is typically referred to as "Vdd." The second voltage reference 203 is typically referred to as "ground." Further, the first inverter is coupled to the transistor M5, and the second inverter is coupled to the transistor M6. In addition to being coupled to the inverters, the transistors M5 and M6 are both coupled to a write word line (WWL) 250 of the memory array 102 and each coupled to a write bit line (WBL) 207 and a write bit bar line (WBBL) 209, respectively. In some embodiments, the transistors M5 and M6 are gated (i.e., turned on or off) by the WWL 250. Typically, the transistors M1 and M3 are referred to as pull-up transistors of the bit cell 102-5; the transistors M2 and M4 are referred to as pull-down transistors of the bit cell 102-5; the transistors M5 and M6 are referred to as access transistors of the bit cell 102-5. In some embodiments, the transistors M2, M4, M5, and M6 each includes an NMOS transistor, and M1 and M3 each includes a PMOS transistor. Although the illustrated embodiments of FIG. 2A shows that M1-M6 are either NMOS or PMOS transistors, any of a variety of transistors or devices that are suitable for use in a memory device may be implemented as at least one of M1-M6 such as, for example, a bipolar junction transistor (BJT), a high-electron mobility transistor (HEMT), etc.

In the read buffer of the bit cell 102-5, the transistors M7 and M8 are serially connected between the voltage reference 203 and the RBL 102-7. Typically, the transistor M7 is referred to as a read driver transistor of the bit cell 102-5, and the transistor M8 is referred to as a read transistor of the bit cell 102-5. Further, the read transistor M8 is gated (i.e., turned on or off) by a read word line (RWL) 252 of row c to access a data bit stored in the 6T core by way of turning on the read driver transistor M7. Details of the operation (e.g., the read operation) of the bit cell 102-5 will be described below. Similarly, although the illustrated embodiments of FIG. 2A shows that M7 and M8 are NMOS transistors, any of a variety of transistors or devices that are suitable for use in a memory device may be implemented as at least one of M7-M8 such as, for example, a bipolar junction transistor (BJT), a high-electron mobility transistor (HEMT), etc.

In some embodiments, each bit cell of the memory arrays 102 and 104 is implemented as the 2P-8T bit cell, as described above. Thus, for clarity, descriptions of the bit cells 102-6, 104-1, and 104-2 will be briefly provided as follows. The bit cell 102-6 includes 8 transistors: M11, M12, M13, M14, M15, M16, M17, and M18 that are substantially similar to the transistors M1, M2, M3, M4, M5, M6, M7, and M8, respectively. Accordingly, a first inverter constituted of M11 and M12 and a second inverter constituted of M13 and M14 are cross-coupled with each other, and are each coupled to a WBL 217 of column B through an access transistor M15 and a WBBL 219 of column B through an access transistor M16, respectively. The access transistors M15 and M16 are also coupled to and gated by the WWL 250. And read driver transistor M17 and read transistor M18 are serially coupled between the voltage reference 203 and the RBL 102-9 of column B, wherein the read transistor M18 is also gated by the RWL 252.

Similarly, the bit cell 104-1 includes 8 transistors: M21, M22, M23, M24, M25, M26, M27, and M28 that are substantially similar to the transistors M1, M2, M3, M4, M5, M6, M7, and M8, respectively. Accordingly, a first inverter constituted of M21 and M22 and a second inverter constituted of M23 and M24 are cross-coupled with each other, and are each coupled to a WBL 227 of column A' through an access transistor M25 and a WBBL 229 of column A' through an access transistor M26, respectively. The access transistors M25 and M26 are also coupled to and gated by a WWL 254 of row a'. And read driver transistor M27 and read transistor M28 are serially coupled between the voltage reference 203 and the RBL 104-7 of column A', wherein the read transistor M28 is also gated by a RWL 256 of row a'.

Similarly, the bit cell 104-2 includes 8 transistors: M31, M32, M33, M34, M35, M36, M37, and M38 that are substantially similar to the transistors M1, M2, M3, M4, M5, M6, M7, and M8, respectively. Accordingly, a first inverter constituted of M31 and M32 and a second inverter constituted of M33 and M34 are cross-coupled with each other, and are each coupled to a WBL 237 of column B' through an access transistor M35 and a WBBL 239 of column B' through an access transistor M36, respectively. The access transistors M35 and M36 are also coupled to and gated by the WWL 254. And read driver transistor M37 and read transistor M38 are serially coupled between the voltage reference 203 and the RBL 104-9 of column B', wherein the read transistor M38 is also gated by the RWL 256.

Regarding the sensing amplifiers (106-1, 106-2, etc.) of the I/O circuit 106, each is substantially similar to one another. Thus, the following discussion will be directed to the sensing amplifier 106-1. As shown, the sensing amplifier 106-1 is implemented as a differential voltage-mode sensing amplifier. More specifically, the sensing amplifier 106-1 includes seven transistors: M41, M42, M43, M44, M45, M46, and M47. The transistor M41 and M42 are formed as a first inverter, and the transistor M43 and M44 are formed as a second inverter, wherein the first and second inverters are cross-coupled with each other. Further, the transistor M45 is coupled between the RBL 104-7 of column A' and the first inverter and is gated by a sensing enablement (SE) signal 260. The transistor M45 is configured to receive either an averaged rBL signal 271 (provided by the RSP unit 116-1) or an rBL signal 273 (from the RBL 104-7), which will be discussed in further detail below with respect to FIG. 3. The transistor M46 is coupled between the RBL 102-7 of column A and the second inverter and is also gated by the SE signal 260. The transistor M46 is configured to receive a regular read bit line (rRBL) signal 275 (from the RBL 102-7), which will be discussed in further detail below with respect to FIG. 3. Still further, the transistor M47 is coupled between the cross-coupled inverters (M41, M42, M43, and M44) and ground (203), and is also gated by the SE signal 260. The sensing amplifier 106-2 also includes seven transistors: M51, M52, M53, M54, M55, M56, and M57 that are substantially similar to the M41, M42, M43, M44, M45, M46, and M47, respectively. Similarly, the transistor M55 is configured to receive either the averaged rBL signal 271 (provided by the RSP unit 116-1) or an rBL signal 277 (from the RBL 104-9), and the transistor M56 is configured to receive an rRBL signal 279 (from the RBL 102-9), which will be discussed in further detail below with respect to FIG. 3.

Although each sensing amplifier of the I/O circuit 106 includes a differential voltage mode sensing amplifier in the current embodiments, the sensing amplifier of the I/O circuit 106 may be implemented as any of a variety of differential sensing amplifiers such as, for example, a differential current mode sensing amplifier, etc.

Referring still to FIG. 2A, the RSP unit 116-1 is implemented as a PMOS transistor. The RSP unit 116-1 is coupled between the RBL's 104-7 and 104-9 and is gated by a reference enablement (RE) signal 258. The RSP unit 116-1 is configured to provide the averaged rBL signal 271 by shorting the rBL signals 273 and 277, in response to the RE signal 258, which will be described in further detail below with respect to FIG. 3. Although the RSP unit 116-1 includes a PMOS transistor, any of a variety of transistors or devices that are suitable for use in a memory device may be implemented as the RSP unit 116-1 such as, for example, a bipolar junction transistor (BJT), a high-electron mobility transistor (HEMT), etc.

In some embodiments, to write a data bit to the bit cell 102-5, the WBL 207 is applied with a signal (e.g., a voltage) corresponding to a first logical state (either a logical 1 or a logical 0), and the WBBL 209 is applied with another signal corresponding to a second logical state that is complementary to the first logical state (i.e., either a logical 0 or a logical 1). Prior to, simultaneously with, or subsequently to the WBL 207 and the WBBL 209 being applied with respective logical states, the WWL 250 is asserted to a high logical state so as to turn on the access transistors M5 and M6. As such, the applied logical states to the WBL 207 and WBBL 209 are subsequently stored at node 213 through the access transistor M5 and at node 215 through the access transistor M6, respectively.

In general, when a bit cell (e.g., 102-5) stores a data bit, a first node of the bit cell is configured to be at a first logical state (either a logical 1 or a logical 0), and a second node of the bit cell is configured to be at a second logical state (either a logical 0 or a logical 1), wherein the first and second logical states are complementary with each other. In some embodiments, the first logical state at the first node is the data bit stored by the bit cell. For example, in the illustrated embodiment of FIG. 2A, when the bit cell 102-5 stores (presents) a logical 0, the node 213 is configured to be at the logical 0 state, and the node 215 is configured to be at the logical 1 state. Similarly, when the bit cell 102-6 stores (presents) a logical 1, node 223 of the bit cell 102-6 is configured to be at the logical 1, and node 225 of bit cell 102-6 is configured to be at the logical 1.

In some embodiments, to read out a data bit from a bit cell of the memory array 102 (FIG. 1), row a' of the memory array 102 serves as the reference row so as to allow each bit cell of the reference row to provide an rBL signal (e.g., 273, 277, etc.), as described above. The following discussion is directed to the read operation performed by the embodiment of the memory device 100 in FIG. 2A, and more specifically, is directed to reading data bits stored at the bit cells 102-5 and 102-6 of the memory array 102. Thus, the following discussion is provided with respect to FIG. 2A and in conjunction with FIG. 3.

Figure 3:
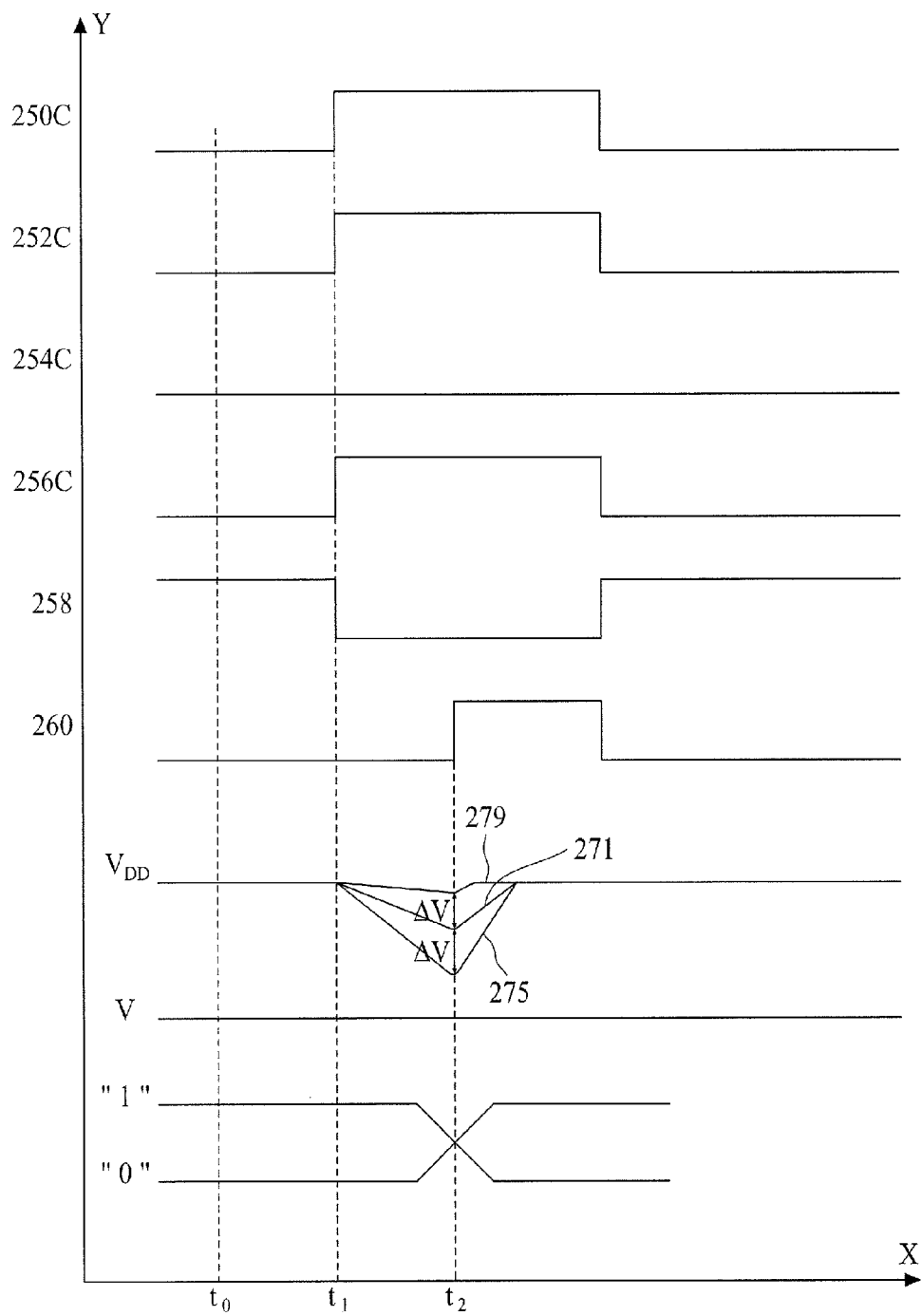
FIG. 3 illustrates exemplary waveforms of plural signals to operate the embodiment of the memory device of FIG. 2A, in accordance with some embodiments.

FIG. 3 illustrates exemplary waveforms of a control signal applied to the WWL 250 (hereinafter "250C"), a control signal applied to the RWL 252 (hereinafter "252C"), a control signal applied to the WWL 254 (hereinafter "254C"), a control signal applied to the RWL 256 (hereinafter "256C"), the RE signal 258, the rRBL signal 275, the rRBL signal 279, the averaged rBL signal 271, the SE signal 260, and data read out from the sensing amplifier (e.g., 106-1, 106-2), respectively, in accordance with various embodiments. In the illustrated embodiment of FIG. 3, each of the waveforms (250C, 252C, 254C, 256C, 258, 260) varies between a logical high state, hereinafter "HIGH," and a logical low state, hereinafter "LOW," (along the Y axis in FIG. 3) over time (along the X axis in FIG. 3). The waveform of the averaged rBL signal 271, the rRBL signal 275, and the rRBL signal 279 transition from Vdd toward ground (0 V) with a respective "rate" over time, which will be discussed in further detail below.

To read out a data bit from the bit cell (e.g., 102-5, 102-6, etc.) of the memory array 102, in some embodiments, the WBL's of at least part of the bit cells (e.g., 207, 217, 227, and 237), the WBBL's of at least part of the bit cells (e.g., 209, 219, 229, and 239), and at least part of the RBL's of the memory device 100 (e.g., 102-7, 102-9, 104-7, and 104-9) are pre-charged to Vdd (201), respectively, i.e., a logical high state. The following discussion will continue using the above example in which the bit cell 102-5 stores a logical 0 (i.e., the node 213 at a logical 0 and the node 215 at a logical 1) and the bit cell 102-6 stores a logical 1 (i.e., the node 223 at a logical 1 and the node 225 at a logical 0).

Referring now to FIG. 3, starting from time "t0," the control signals 250C, 252C, 254C, 256C, and the SE signal 260 are at LOW, respectively. And the RE signal 258, the averaged rBL signal 271, the rRBL signal 275, and the rRBL signal 279 are at HIGH, respectively. As such, the WWL 250 is not asserted (250C at LOW) so that the access transistors M5, M6, M15, and M16 are turned off; the RWL 252 is not asserted (252C at LOW) so that the read transistors M8 and M18 are turned off; the WWL 254 is at ground (254C at LOW) so that the access transistors M25, M26, M35, and M36 are turned off; the RWL 256 is not asserted (256C at LOW) so that the read transistors M28 and M38 are turned off; the transistor M47 is turned off (260 at LOW); the RSP unit 116-1 is turned off (258 at HIGH); the RBL's 102-7, 102-9, 104-7, and 104-9 are pre-charged (the averaged rBL signal 271, the rRBL signal 275, and the rRBL signal 279 are at HIGH).

Continuing to time "t1," the control signals 250C, 252C, 256C transition from LOW to HIGH; the control signal 254C and the SE signal 260 remain at LOW; and the RE signal transitions from HIGH to LOW. When the control signal 250C transitions from LOW to HIGH, the WWL 250 is asserted and accordingly, the access transistors M5, M6, M15, and M16 are turned on. And when the control signal 252C transitions from LOW to HIGH, the RWL 252 is asserted such that the read transistors M8 and M18 are turned on. It is noted that the transistor M7 is turned on because the node 215 (coupled to a gate of M7) is at a logical 1 (i.e., HIGH), and transistor M17 is turned off because the node 225 (coupled to a gate of M17) is at a logical 0 (i.e., LOW). As such, a discharging path 281 (as shown in the bit cell 102-5 of FIG. 2A) may be formed from the RBL 102-7, through the transistors M8 and M7, and to ground (203), and a leakage path 283 (as shown in the bit cell 102-6 of FIG. 2A) may be formed from the RBL 102-9, and through the transistor M18, respectively.

Consequently, referring back to FIG. 3, each of the rRBL signal 275 and the rRBL signal 279 starts to transition from HIGH to LOW with a respective rate. In other words, the rRBL signal 275 is associated with a discharging rate (i.e., the negative slope of the waveform of the rRBL signal 275 in FIG. 3), and the rRBL signal 279 is associated with a leakage rate (i.e., the negative slope of the waveform of the rRBL signal 279 in FIG. 3).

In some embodiments, in order to provide the averaged rBL signal 271 with an intermediate (discharging) rate as a reference, at least a first reference signal with a discharging rate (e.g., the rBL signal 275) and a second reference signal with a leakage rate (e.g., the rBL signal 279) are to be provided. More specifically, the averaged rBL signal 271 is configured to serve as a reference with an intermediate discharging rate for the sensing amplifier (e.g., 106-1, 106-2) to differentiate a voltage drop present on the RBL's 102-7 (i.e., the rRBL signal 275) and 102-9 (i.e., the rRBL signal 279), respectively. For example, the averaged rBl signal 271 may be used by the sensing amplifier 106-1 as a reference to compare the rRBL signal 275 and sense the logic state of the rRBL signal 275 without requiring a full-voltage swing to read the logic state. Similarly, the averaged rBL signal 271 may also be used by the sensing amplifier 106-2 as a reference to compare the rRBL signal 279, which again results in reading the logic state of the signal 279 without requiring a full-voltage swing. A conventional single-ended sensing amplifier may require the rRBL signal 275 to transition from Vdd to ground (i.e., a full-voltage swing) to read out a logic state from the bit cell 102-5, which causes the above-identified issues. In this regard, according to various embodiments of the present disclosure, any two adjacent bit cells along the reference row (e.g., row a' of the memory array 104) are each written with a logical 1 and a logical 0, respectively, so as to provide a first reference signal with a discharging rate (e.g., the rBL signal 273) and a second reference signal with a leakage rate (e.g., the rBL signal 277) to be averaged as an averaged reference signal (e.g., the signal 271).

Referring now to the bit cells 104-1 and 104-2 along the reference row a' (FIG. 2A), in some embodiments, the bit cell 104-1 has been written with a logical 0 through applying a logical 0 on the WBL 227 and a logical 1 on the WBBL 229, and the bit cell 104-2 has been written with a logical 1 through applying a logical 1 on the WBL 237 and a logical 0 on the WBBL 239, already (i.e., before the time t0). Referring back to FIG. 3, still at time "t1," the control signal 256C transitions from LOW to HIGH, similar to the operation discussed above, a discharging path 285 (as shown in the bit cell 104-1 of FIG. 2A) may be formed from the RBL 104-7, through the transistors M28 and M27, and to ground (203), and a leakage path 287 (as shown in the bit cell 104-2 of FIG. 2A) may be formed from the RBL 104-9, and through the transistor M38. As such, the rBL signal 273 is associated with a discharging rate (similar to the rRBL signal 275), and the rBL signal 277 is associated with a leakage rate (similar to the rRBL signal 279). In some embodiments, the rBL signals 273 and 277 may serve as the first and second reference signals, respectively, which are averaged (e.g., shorted together) to provide the averaged rBL signal 271, as mentioned above. Still at time "t1," the RE signal 258 transitions from HIGH to LOW, which turns on the RSP unit 116-1 (the PMOS transistor M61). As such, the RSP unit 116-1 shorts the rBL signals 273 and 277 (i.e., the first and second reference signals) so as to average the discharging rate associated with the rBL signal 273 and the leakage rate associated with the rBL signal 277. Consequently, the averaged rBL signal 271 associated with an "intermediate" (discharging) rate, as shown in FIG. 3, is generated.

Referring again to FIG. 2A, in some embodiments, the rRBL signal 275 (provided based on reading out the logical 0 at the bit cell 102-5) and the averaged rBL signal 271 serve as differential input signals to the sensing amplifier 106-1, and the rRBL signal 279 (provided based on reading out the logical 1 at the bit cell 102-6) and the averaged rBL signal 271 serve as differential input signals to the sensing amplifier 106-2. Referring back to FIG. 3, continuing to time "t2," all the signals each remains at its respective logical state except that the SE signal 260 transitions from LOW to HIGH. In some embodiments, the timing for the SE signal 260 to transition from LOW to HIGH may be predetermined by a designer/user of the sensing amplifier 106-1/106-2 based on when a large enough voltage is presented between the differential input signals (i.e., a voltage difference ΔV either between the rRBL signal 275 and the averaged rBL signal 271, and/or between the rRBL signal 279 and the averaged rBL signal 271). When the SE signal 260 transition from LOW to HIGH (i.e., at time "t2"), the transistor M47 is enabled (turned on) so that the sensing amplifier 106-1 amplifies the large enough voltage difference (ΔV) to provide an output data that corresponds to the data bit read from the bit cell 102-5 (e.g., a logical 0). In some embodiments, the output data may be provided to the control logic circuit 120 (FIG. 1) through node X (FIG. 2A) of the first inverter that is formed of the transistors M41 and M42. Similarly, the transistor M57 is enabled (turned on) so that the sensing amplifier 106-2 amplifies the large enough voltage difference (ΔV) to provide an output data that corresponds to the data bit read from the bit cell 102-6 (e.g., a logical 1). In some embodiments, the output data may be provided to the control logic circuit 120 (FIG. 1) through node Y (FIG. 2A) of the first inverter that is formed of the transistors M51 and M52.

It is noted that the voltage difference (ΔV) is about 50 mV or less when Vdd is about 1 V, in accordance with various embodiments. Such a substantially small voltage difference compared to Vdd (i.e., the full-voltage swing) provides a variety of advantages such as the read speed, as described above. More particularly, conventional memory devices using single-ended 2P-8T bit cells generally require a full-voltage swing (e.g., 1 V) present on an RBL so as to read out a data bit. In stark contrast, the disclosed memory device (e.g., 100) can read out a data bit from the single-ended 2P-8T bit cell (e.g., 105-5, 102-6, etc.) by using a differential sensing amplifier when a substantially small voltage difference (e.g., 50 mV) is sensed between the differential input signals to the differential sensing amplifier.

The exemplary circuit diagram of FIG. 2B is substantially similar to FIG. 2A except that node 291 of the bit cell 104-1 is hardwired to Vdd (201) and node 293 of the bit cell 104-2 is hardwired to ground (203). Thus, only the bit cells 104-1 and 104-2 are shown. As such, without writing respective logical states through the WBL's and WBBL's as described above, the bit cell 104-1 permanently stores a logical 0 (similar to FIG. 2A), and the bit cell 104-2 permanently stores a logical 1 (similar to FIG. 2A). In some embodiments, such permanently stored logical states may advantageously improve the operation speed of the memory device 100 because of requiring no write operations to provide a reference row.

As described above, the exemplary circuit diagram of FIG. 2C further includes the additional RSP unit 117-1 because row c of the memory array 102 may also serve as a reference row. To operate such a memory device with two reference rows that respectively belong to two separate memory arrays, in some embodiments, the RSP units 116-1 and 117-1 (i.e., the PMOS transistors M61 and M71) may be complementarily enabled. More specifically, when the transistor M61 is enabled (turned on by the RE signal 258), the transistor M71 is disabled (turned off by RE signal 298). As such, the memory device of FIG. 2C performs a substantially identical (read) operation to the embodiment of FIG. 2A, as described above. On the other hand, when the transistor M61 is disabled (turned off by the RE signal 258), the transistor M71 is enabled (turned on by the RE signal 298). As such, the reference row c of the memory array 102 may perform a substantially similar operation to the reference row a' of the memory device 104, as described with respect to FIG. 2A, so as to provide an averaged rBL signal 299 by shorting first and second reference signals (275 and 279). More specifically, the control signal 250C may remain at LOW (similar to 254C of FIG. 2A and FIG. 3), and the bit cells 102-5 and 102-6 are written with a logical 0 and a logical 1, respectively. Upon the RWL signal 252C transitioning from LOW to HIGH (i.e., read transistors M8 and M18 are turned on), the first reference signal 275 associated with a discharging rate and the second reference signal 279 associated with a leakage rate are provided. Consequently, the PMOS transistor M71 (the RSP unit 117-1) shorts the first and second reference signals (275 and 279) so as to provide the averaged rBL signal 299 associated with an intermediate (discharging) rate. In some embodiments, for example, the bit cell 104-1 stores a logical 0 to be read out, and the bit cell 104-2 stores a logical 1 to be read out. As such, when the read transistors M28 and M38 are enabled (turned on), signal 273 associated with a discharging rate (similar to the signal 275 of FIG. 3) and signal 277 associated with a leakage rate (similar to the signal 279 of FIG. 3) are provided. More specifically, the signal 273 represents a discharging path 301 from the RBL 104-7, through the read transistor M28, and to the read driver transistor M27 in the bit cell 104-1, and the signal 277 represents a leakage path 303 from the RBL 104-9, and through the read transistor M38 in the bit cell 104-2. The sensing amplifier 106-1 then uses the averaged rBL signal 299 (with the intermediate rate)

and the signal 273 (with the discharging rate) as its differential input signals, and in response to an asserted SE signal 260, amplifies the large enough voltage difference (ΔV) between the averaged rBL signal 299 and the signal 273 to provide an output data that reflects the logical state stored in the bit cell 104-1. Similarly, the sensing amplifier 106-2 then uses the averaged rBL signal 299 (with the intermediate rate) and the signal 277 (with the leakage rate) as its differential input signals, and in response to an asserted SE signal 260, amplifies the large enough voltage difference (ΔV) between the averaged rBL signal 299 and the signal 277 to provide an output data that reflects the logical state stored in the bit cell 104-2.

In some alternative or additional embodiments, the memory device 100 may further include one or more keeper circuits (e.g., 302, 304, 306, 308, etc.), as shown in FIG. 2C. More specifically, in some embodiments, each sensing amplifier may be coupled with at least one of such keeper circuits at the sensing amplifier's input end. For example, in the illustrated embodiment of FIG. 2C, keeper circuits 302 and 304 are coupled to the sensing amplifier 106-1 at the transistors M45 and M46, respectively, and keeper circuits 306 and 308 are coupled to the sensing amplifier 106-2 at the transistors M55 and M56, respectively. In some embodiments, the keeper circuit includes an always-on PMOS transistor (because it is gated by a LOW state) and is configured to improve a readability of the respectively coupled bit cell by constantly providing a voltage source, e.g., Vdd (because of being coupled between Vdd and ground at source and drain, respectively). For example, the keeper circuit 302 is configured to improve the readability of the bit cell 104-1 by providing Vdd to the bit cell 104-1 through the RBL 104-7; the keeper circuit 304 is configured to improve the readability of the bit cell 102-5 by providing Vdd to the bit cell 102-5 through the RBL 102-7; the keeper circuit 306 is configured to improve the readability of the bit cell 104-2 by providing Vdd to the bit cell 104-2 through the RBL 104-9; the keeper circuit 308 is configured to improve the readability of the bit cell 102-6 by providing Vdd to the bit cell 102-6 through the RBL 102-9.

Figure 4:
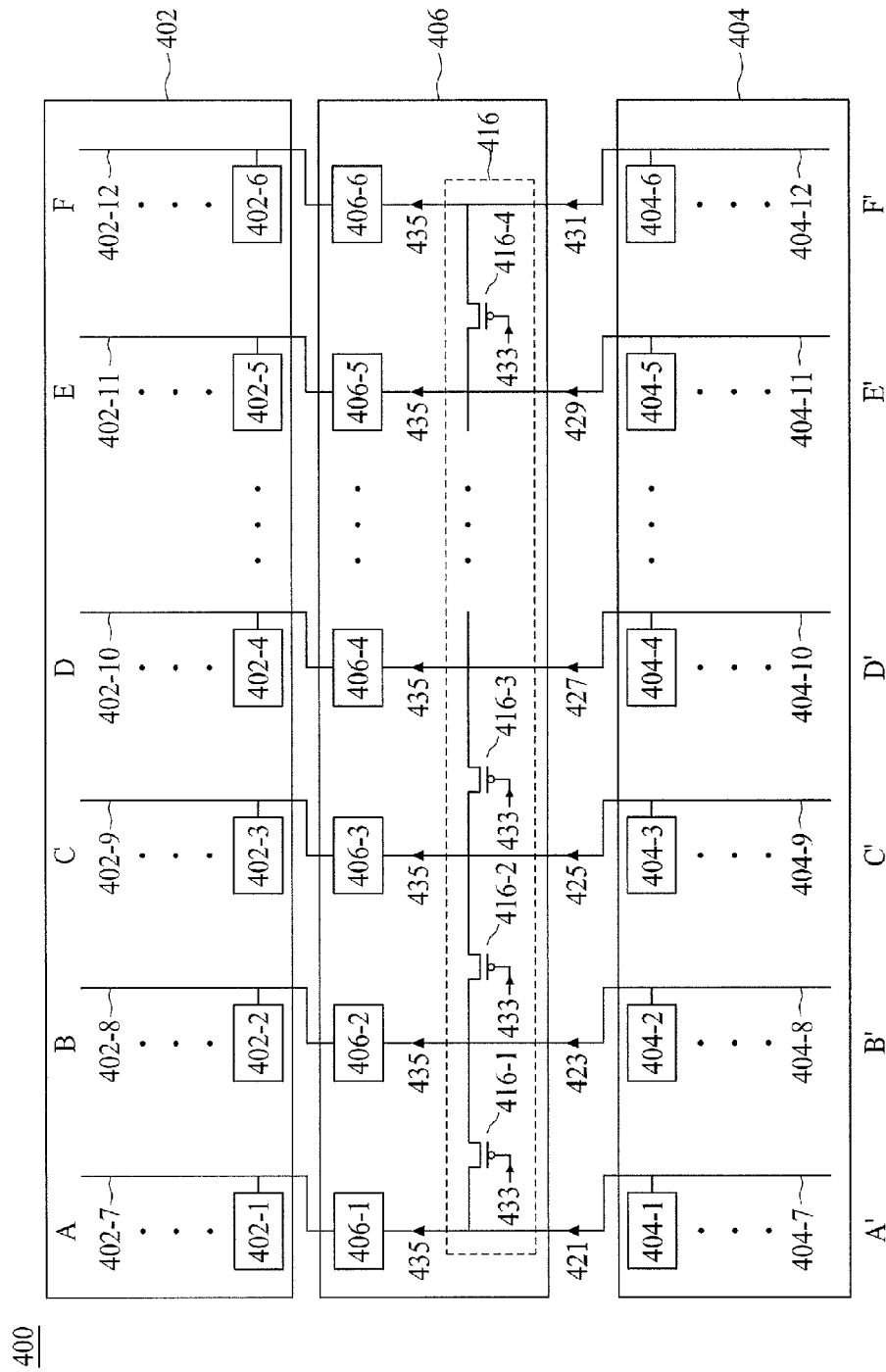
FIG. 4 illustrates an exemplary block diagram of another memory device that includes first and second memory arrays with an input/output (I/O) circuit coupled therebetween, in accordance with some embodiments.

FIG. 4 illustrates an alternative embodiment of a memory device 400 that is substantially similar to the memory device 100 of FIG. 1 except that the memory device 400 further includes plural RSP units (e.g., 416-2) that allow more reference bit line (rBL) signals to be shorted, which will be described in further detail below. For example, the memory device 400 also includes at least two memory arrays 402 and 404 with an input/output (I/O) circuit 406 being coupled therebetween.

Similar to the memory arrays 102 and 104 (FIG. 1), the memory arrays 402 and 404 each includes a plurality of dual-port bit cells (e.g., a 2P-8T bit cell) that are arranged in a column-row configuration, and each column includes at least one bit line (BL), e.g., a read bit line (RBL). In the illustrated embodiment of FIG. 4, the memory array 402 includes bit cells: 402-1, 402-2, 402-3, 402-4, 402-5, and 402-6 that are arranged in columns A, B, C, D, E, F, respectively. Moreover, as shown, column A includes RBL 402-7; column B includes RBL 402-8; column C includes RBL 402-9; column D includes RBL 402-10; column E includes RBL 402-11; column F includes RBL 402-12. The memory array 404 includes bit cells: 404-1, 404-2, 404-3, 404-4, 404-5, and 404-6 that are arranged in columns A', B', C', D', E', F', respectively. Moreover, as shown, column A' includes RBL 404-7; column B' includes RBL 404-8; column C' includes RBL 404-9; column D' includes RBL 404-10; column E' includes RBL 404-11; column F' includes RBL 404-12. In some embodiments, a row of the memory array 404 may serve as a reference row, for example, the row that include the bit cells 404-1, 404-2, 404-3, 404-4, 404-5, and 404-6.

Similar to the I/O circuit 106 (FIG. 1), the I/O circuit 406 also includes a plurality of (dual-end) sensing amplifiers, wherein each of the sensing amplifiers is coupled to bit cells along a corresponding column of the memory array 402 and a corresponding column of the memory array 404, respectively. As described above, each column includes an RBL. In some embodiments, each sensing amplifier may be coupled to the bit cells through the corresponding columns' RBL's of the memory arrays 402 and 404, respectively. In the illustrated embodiment of FIG. 4, the I/O circuit 406 includes sensing amplifiers: 406-1, 406-2, 406-3, 406-4, 406-5, and 406-6, and the sensing amplifier 406-1 is coupled to the bit cells along the RBL 402-7 and the bit cells along the RBL 404-7, respectively; the sensing amplifier 406-2 is coupled to the bit cells along the RBL 402-8 and the bit cells along the RBL 404-8, respectively; the sensing amplifier 406-3 is coupled to the bit cells along the RBL 402-9 and the bit cells along the RBL 404-9, respectively; the sensing amplifier 406-4 is coupled to the bit cells along the RBL 402-10 and the bit cells along the RBL 404-10, respectively; the sensing amplifier 406-5 is coupled to the bit cells along the RBL 402-11 and the bit cells along the RBL 404-11, respectively; the sensing amplifier 406-6 is coupled to the bit cells along the RBL 402-12 and the bit cells along the RBL 404-12, respectively.

Similar to the RSP circuit 116 of I/O circuit 106 (FIG. 1), RSP circuit 416 of the I/O circuit 406 includes a plurality of RSP units, and each RSP unit is coupled to any two (adjacent) RBL's of the memory array that includes the reference row. As such, each column (RBL) may be coupled to a respective RSP unit. For example, in the illustrated embodiment of FIG. 4, RSP unit 416-1 is coupled to the RBL's 404-7 and 404-8; RSP unit 416-2 is coupled to the RBL's 404-8 and 404-9; RSP unit 416-3 is coupled to the RBL's 404-9 and 404-10; RSP unit 416-4 is coupled to the RBL's 404-11 and 404-12. In some embodiments, the RSP units 416-1, 416-2, 416-3, and 416-4 are each implemented as a PMOS transistor.

Operatively, each of the RSP units 416-1, 416-2, 416-3, and 416-4 is configured to short rBL signals present on the respective RBL's and is gated by a reference enable (RE) signal (similar to the RE signal 258). For example, the RSP unit 416-1 is configured to short rBL signals 421 and 423 present on the RBL's 404-7 and 404-8, respectively; the RSP unit 416-2 is configured to short rBL signals 423 and 425 present on the RBL's 404-8 and 404-9, respectively; the RSP unit 416-3 is configured to short rBL signals 425 and 427 present on the RBL's 404-9 and 404-10, respectively; the RSP unit 416-4 is configured to short rBL signals 429 and 431 present on the RBL's 40411 and 404-12, respectively. In some embodiments, the rBL signals short by each RSP unit (416-1, 416-2, 416-3, 416-4, etc.) may be associated with a discharging rate and a leakage rate, respectively. Further, shorting two respective rBL signals present on any two adjacent RBL's allows an averaged rBL signal, e.g., 435, that is globally shared by the plural sensing amplifiers of the I/O circuit 406 (e.g., 406-1, 406-2, 406-3, 406-4, 406-5, 406-6, etc.). Consequently, the averaged rBL signal 435 is associated with an intermediate discharging rate that is based on averaging plural pairs of discharging and leakage rates, which may further provide a variety of advantages. For example, although bit cells in the memory device 400 are substantially similar to one another, due to manufacturing variations, each bit cell may present a respective characteristic while being accessed (e.g., a respective discharging/leakage rate while being read). In other words, the discharging and leakage rates across the memory device 400 may each be formed as a normal distribution. As such, an intermediate discharging rate by averaging a single pair of discharging and leakage rates may be non-repeatable because the averaged discharging rate and/or leakage rate may be located outside one or more standard deviations in its respective normal distribution. It is understood by persons skilled in the art that the presence of such discharging/leakage rates outside one or more standard deviations occurs infrequently in a normal distribution and thus may not be repeatable. In some embodiments, since the intermediate discharging rate (associated with the averaged rBL signal 435) is provided by averaging plural pairs of discharging and leakage rates, the intermediate discharging rate may be less sensitive to the manufacturing variations and thus more repeatable and reliable. In some embodiments, the RSP units 416-1, 416-2, 416-3, and 416-4 are all gated by an RE signal 433. That is, the RSP units 416-1, 416-2, 416-3, and 416-4 may be turned on or off concurrently.

As described above with respect to FIG. 2A, in some embodiments, each rBL signal may be associated with either a discharging rate or a leakage rate. In such an embodiment of FIG. 4, the averaged rBL signal 435 may be associated with a (discharging) rate that is based on averaging two or more pairs of a discharging rate and a leakage rate (e.g., discharging rates on signals 421, 425, 429, etc., and leakage rates on signals 423, 427, 431, etc.). As such, the averaged rBL signal may be associated with a substantially reliable discharging rate.

Figure 5:
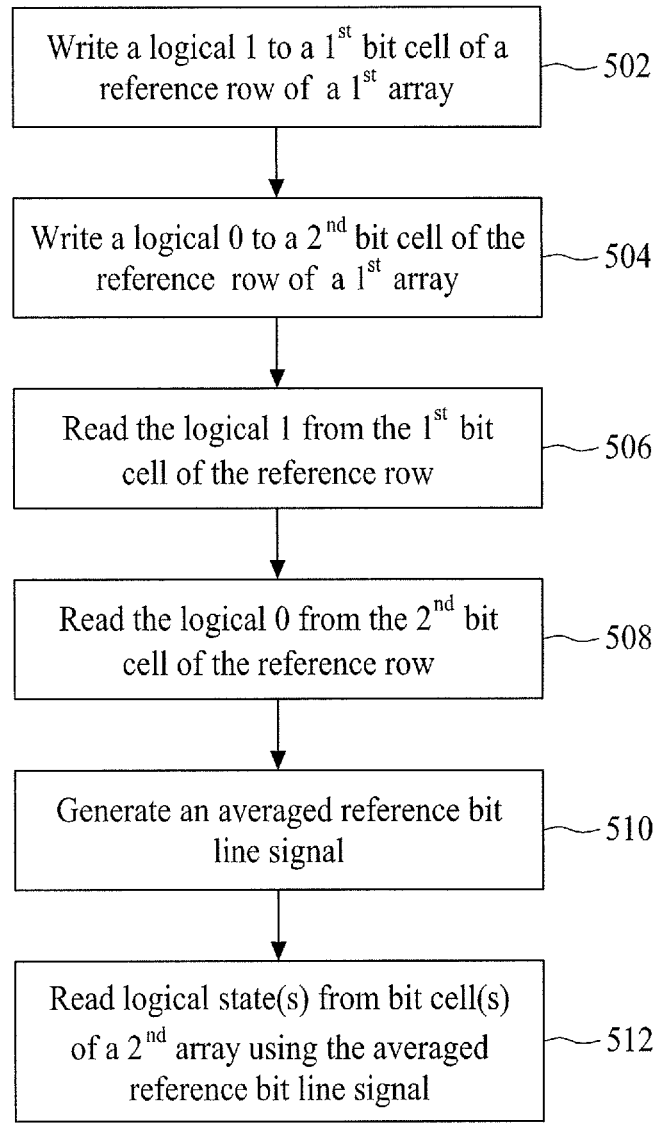
FIG. 5 illustrates a flow chart of a method to operate the memory device of FIG. 1, in accordance with various embodiments.

FIG. 5 illustrates a flow chart of a method 500 to read out a data bit from a first memory array using a reference row included in a second memory array, in accordance with various embodiments. In various embodiments, the operations of the method 500 are performed by the respective components illustrated in FIGS. 1-4. For purposes of discussion, the following embodiment of the method 500 will be described in conjunction with FIGS. 1-4. The illustrated embodiment of the method 500 is merely an example. Therefore, it should be understood that any of a variety of operations may be omitted, re-sequenced, and/or added while remaining within the scope of the present disclosure.

The method 500 starts with operation 502 in which either a logical 1 or a logical 0 is written to a first bit cell of a reference row of a first memory array, in accordance with various embodiments. In some embodiments, each bit cell of the first memory array may include a 2P-8T bit cell. Using the embodiment of FIG. 2A as an example, row a' of the memory array 104 is selected as a reference row, and accordingly the bit cell 104-1 (the first bit cell) is written with a logical 0.

The method 500 continues to operation 504 in which either a logical 0 or a logical 1 (complementary to the logical state written to the first bit cell in operation 502) is written to a second bit cell of the reference row of the first memory array, in accordance with various embodiments. Continuing with the same example, the bit cell 104-2 is written with a logical 1 (complementary to the logical 0 written to the first bit cell).

The method 500 continues to operation 506 in which the logical state written to the first bit is read out as a first reference bit line (rBL) signal, in accordance with various embodiments. More specifically, depending on the logical state of the first bit cell, the first rBL signal may be associated with either a discharging rate or a leakage rate. In the above example, the first rBL signal 273 is associated with a discharging rate.

The method 500 continues to operation 508 in which the logical state written to the first bit is read out as a second reference bit line (rBL) signal, in accordance with various embodiments. More specifically, depending on the logical state of the second bit cell, the second rBL signal may be associated with either a discharging rate or a leakage rate. In the above example, the second rBL signal 277 is associated with a leakage rate.

The method 500 continues to operation 510 in which an averaged rBL signal is generated based on the first and second rBL signals, in accordance with various embodiments. In some embodiments, the averaged rBL signal is generated by an RSP unit coupled to the first memory array by shorting the first and second rBL signals. As such, the averaged rBL signal is associated with an intermediate discharging rate that is valued between the discharging rate of the first rBL signal 273 and the leakage rate of the second rBL signal 277. In accordance with the above example in FIG. 2A, the averaged rBL signal 271 is generated by the RSP unit 116-1 (e.g., M61) by shorting the rBL signals 273 and 277.

The method 500 continues to operation 512 in which a logical state stored in a bit cell of a second memory array is read out by a differential sensing amplifier coupled between the first and second memory arrays, in accordance with various embodiments. In some embodiments, at least the bit cell being read out in the second memory array includes a dual-port bit cell (e.g., a 2P-8T bit cell). Accordingly, the logical state read out from the second memory array may serve as a regular read bit line (rRBL) signal. More specifically, the differential amplifier uses the averaged rBl signal and the rRBL signal as its differential input signals, respectively, to sense a large enough voltage difference (e.g., 50 mV or less) so as to generate an output signal that reflects the logical state stored in the bit cell of the second memory array.

In an embodiment, a memory device is disclosed. The memory device includes a first memory array comprising a first bit cell and a second bit cell that are configured to provide a first reference signal and a second reference signal, respectively; a second memory array comprising a third bit cell that is configured to store a first logical state; a reference signal provision (RSP) unit, coupled to the first memory array, and configured to short the first and second reference signals so as to provide an averaged reference signal; and a sensing amplifier, coupled between the RSP unit and the second memory array, and configured to use the averaged reference signal to read out the first logical state stored by the third bit cell.

In another embodiment, a memory device includes a first memory array comprising a first plurality of bit cells disposed along a row of the first memory array, wherein each of the first plurality of bit cells along the row is configured to provide a reference signal; a second memory array comprising a second plurality of bit cells, wherein each of the second plurality of bit cells is configured to store a respective logical state; a reference signal provision (RSP) circuit, coupled to the first memory array, and configured to short the reference signals so as to provide a globally averaged reference signal; and a plurality of sensing amplifiers, coupled between the RSP circuit and the second memory array, and each configured to use the averaged reference signal to read out the respective logical state presented at each bit cell of the second memory array.

Yet in another embodiment, a memory device includes a first memory array comprising a first bit cell and a second bit cell that are configured to provide a first reference signal with a discharging rate and a second reference signal with a leakage rate, respectively, when the first and second bit cells are being accessed; a second memory array comprising a third bit cell that is configured to store a first logical state; a reference signal provision (RSP) unit, coupled to the first memory array, and is configured to short the first and second reference signals so as to provide an averaged reference signal with an intermediate discharging rate that is valued between the discharging rate and the leakage rate; and a differential sensing amplifier, coupled between the RSP unit and the second memory array, and configured to use the intermediate discharging rate to read out the first logical state presented at the third bit cell.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first memory array comprising a first bit cell and a second bit cell that are configured to provide a first reference signal and a second reference signal, respectively;
   a second memory array comprising a third bit cell that is configured to store a first logical state;
   a reference signal provision (RSP) unit, coupled to the first memory array, and configured to short the first and second reference signals so as to provide an averaged reference signal; and
   a sensing amplifier, coupled between the RSP unit and the second memory array, and configured to use the averaged reference signal to read out the first logical state stored by the third bit cell.

2. The memory device of claim 1, wherein the first reference signal is associated with a discharging rate, and the second reference signal is associated with a leakage rate.

3. The memory device of claim 2, wherein the averaged reference signal is associated with an intermediate rate that is valued between the discharging rate and the leakage rate.

4. The memory device of claim 1, wherein the first, second and third bit cells each includes a single-ended memory bit cell.

5. The memory device of claim 1, wherein the RSP unit includes a PMOS transistor.

6. The memory device of claim 1, wherein the sensing amplifier includes a differential sensing amplifier that is configured to receive differential input signals.

7. The memory device of claim 1, wherein the first logical state is either a logical 1 or a logical 0.

8. The memory device of claim 1, wherein the second memory array further includes a fourth bit cell that is configured to store a second logical state complementary to the first logical state.

9. The memory device of claim 8, wherein the sensing amplifier is configured to use the averaged reference signal to read out the second logical state stored by the fourth bit cell.

10. A memory device, comprising:
    a first memory array comprising a first plurality of bit cells disposed along a row of the first memory array, wherein each of the first plurality of bit cells along the row is configured to provide a reference signal;
    a second memory array comprising a second plurality of bit cells, wherein each of the second plurality of bit cells is configured to store a respective logical state;
    a reference signal provision (RSP) circuit, coupled to the first memory array, and configured to short the reference signals so as to provide a globally averaged reference signal; and
    a plurality of sensing amplifiers, coupled between the RSP circuit and the second memory array, and each configured to use the averaged reference signal to read out the respective logical state presented at each bit cell of the second memory array.

11. The memory device of claim 10, wherein a first bit cell of the first plurality of bit cells of the first memory array is configured to provide a first reference signal associated with a discharging rate.

12. The memory device of claim 11, wherein a second bit cell of the first plurality of bit cells of the first memory array is configured to provide a second reference signal associated with a leakage rate.

13. The memory device of claim 12, wherein the averaged reference signal is associated with an intermediate rate that is an averaged value of the discharging rate and the leakage rate.

14. The memory device of claim 10, wherein the first and second pluralities of bit cells each includes a single-ended memory bit cell.

15. The memory device of claim 10, wherein the RSP circuit includes a plurality of PMOS transistors.

16. The memory device of claim 15, wherein at least a first PMOS transistor is coupled to a first pair of adjacent bit cells of the first plurality of bit cells, a second PMOS transistor is coupled to a second pair of adjacent bit cells of the first plurality of bit cells, and a third PMOS transistor is coupled to the first and second PMOS transistors.

17. The memory device of claim 16, wherein the first PMOS transistor is configured to short reference signals respectively provided by the first pair of adjacent bit cells so as to provide a first averaged reference signal, the second PMOS transistor is configured to short reference signals respectively provided by the second pair of adjacent bit cells so as to provide a second averaged reference signal, and the third PMOS transistor is configure to short the first and second averaged reference signals so as to provide the globally averaged reference signal.

18. The memory device of claim 17, wherein the reference signals provided by the first pair of adjacent bit cells include a first discharging rate and a first leakage rate, respectively, the reference signals provided by the second pair of adjacent bit cells include a second discharging rate and a second leakage rate, respectively, and wherein the first discharging rate is different from the second discharging rate and the first leakage rate is different from the second leakage rate.

19. A memory device, comprising:
    a first memory array comprising a first bit cell and a second bit cell that are configured to provide a first reference signal with a discharging rate and a second reference signal with a leakage rate, respectively, when the first and second bit cells are being accessed;

a second memory array comprising a third bit cell that is configured to store a first logical state;

a reference signal provision (RSP) unit, coupled to the first memory array, and is configured to short the first and second reference signals so as to provide an averaged reference signal with an intermediate discharging rate that is valued between the discharging rate and the leakage rate; and a differential sensing amplifier, coupled between the RSP unit and the second memory array, and configured to use the intermediate discharging rate to read out the first logical state presented at the third bit cell.

20. The memory device of claim 19, wherein the RSP unit include a PMOS transistor.

* * * * *